US008288870B2

(12) United States Patent
Hsieh

(10) Patent No.: US 8,288,870 B2
(45) Date of Patent: Oct. 16, 2012

(54) SEMICONDUCTOR CHIP PACKAGE AND METHOD FOR DESIGNING THE SAME

(75) Inventor: Tung-Hsien Hsieh, Changhua County (TW)

(73) Assignee: Mediatek Inc., Hsin-Chu (TW)

( * ) Notice: Subject to any disclaimer, the term of this patent is extended or adjusted under 35 U.S.C. 154(b) by 171 days.

(21) Appl. No.: 12/880,859

(22) Filed: Sep. 13, 2010

(65) Prior Publication Data
US 2011/0001239 A1 Jan. 6, 2011

Related U.S. Application Data

(62) Division of application No. 11/946,255, filed on Nov. 28, 2007, now Pat. No. 7,884,481.

(60) Provisional application No. 60/953,475, filed on Aug. 2, 2007.

(51) Int. Cl.
| H01L 23/22 | (2006.01) |
| H01L 23/24 | (2006.01) |
| H01L 23/48 | (2006.01) |
| H01L 23/52 | (2006.01) |
| H01L 29/40 | (2006.01) |

(52) U.S. Cl. ......... 257/773; 257/678; 257/698; 257/734

(58) Field of Classification Search .......... 257/678–700, 257/773–786, E21.058, E23.015
See application file for complete search history.

(56) References Cited

U.S. PATENT DOCUMENTS

| 5,936,848 | A | 8/1999 | Mehr et al. |
| 6,011,695 | A | 1/2000 | Dumke |
| 6,538,307 | B1 | 3/2003 | Valluri et al. |
| 6,777,802 | B1 | 8/2004 | Mora et al. |
| 6,897,555 | B1 | 5/2005 | Lim et al. |
| 7,161,251 | B2 | 1/2007 | Vonstaudt |
| 7,453,142 | B2 | 11/2008 | Lee et al. |
| 7,667,321 | B2 | 2/2010 | Rebelo et al. |
| 7,915,718 | B2 * | 3/2011 | Lee et al. ...................... 257/668 |
| 7,932,615 | B2 * | 4/2011 | Rinne ........................... 257/786 |
| 8,035,202 | B2 * | 10/2011 | Watanabe et al. ............. 257/635 |
| 2005/0156322 | A1 | 7/2005 | Smith et al. |
| 2006/0097387 | A1 | 5/2006 | Ding |
| 2006/0118972 | A1 | 6/2006 | Baek et al. |
| 2006/0237843 | A1 | 10/2006 | Yanaka |
| 2007/0176295 | A1 | 8/2007 | Chinthakindi et al. |
| 2008/0227284 | A1 | 9/2008 | Rebelo et al. |

* cited by examiner

*Primary Examiner* — Cuong Q Nguyen
(74) *Attorney, Agent, or Firm* — Thomas|Kayden

(57) ABSTRACT

A semiconductor chip package is disclosed. The semiconductor chip package comprises a package substrate having a bottom surface. At least four adjacent ball pads are on the bottom surface, arranged in a first two-row array along a first direction and a second direction. At least four vias are drilled through the package substrate, arranged in a second two-row array, wherein each of the vias in a row of the second two-row array is offset by a first distance along the first direction and a second distance along the second direction from the connecting ball pads in a row of the first two-row array, and each of the vias in the other adjacent row of the second two-row array is offset by the first distance along an opposite direction to the first direction and the second distance along the second direction from the connecting ball pads in the other adjacent row of the first two-row array.

18 Claims, 14 Drawing Sheets

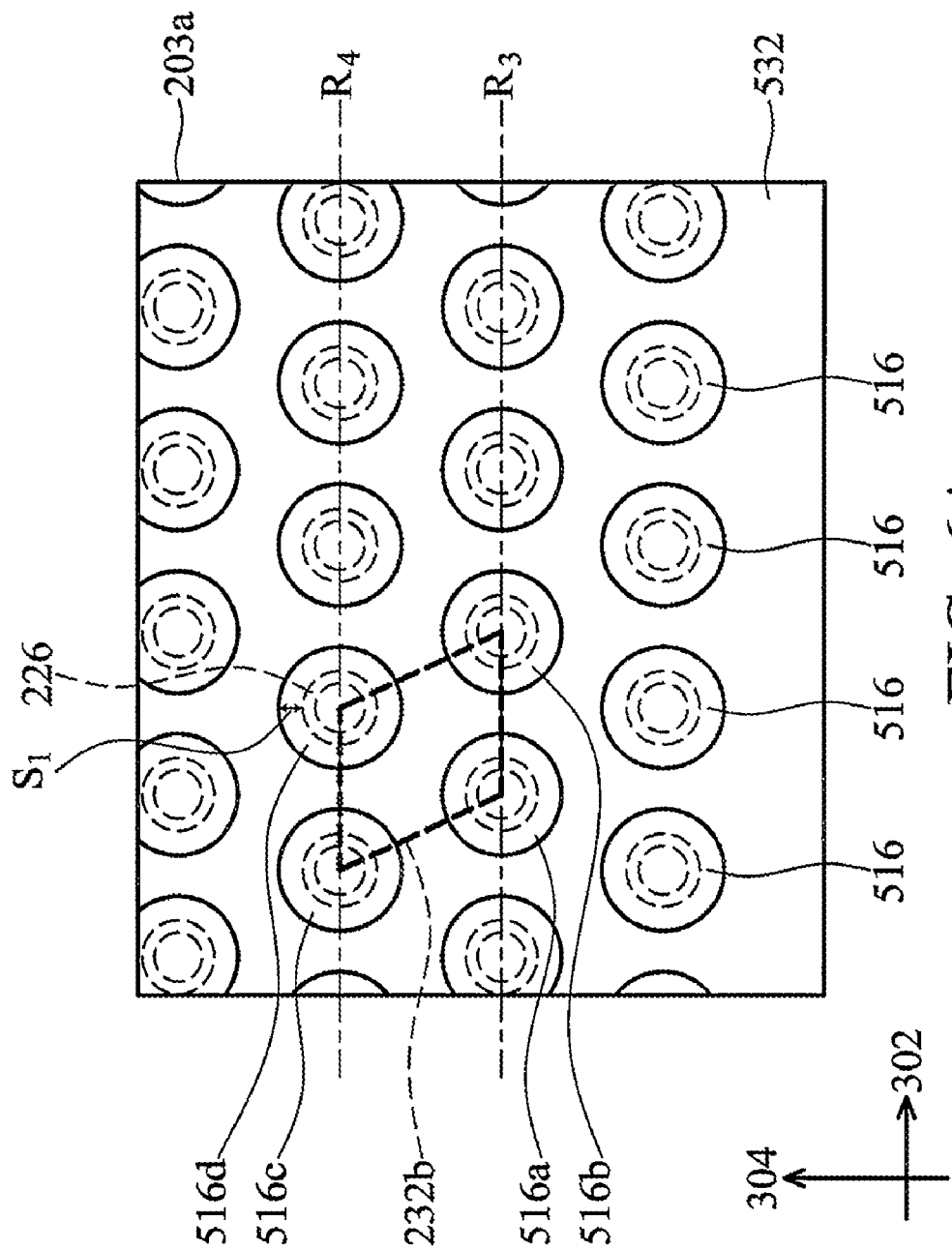

SEMICONDUCTOR CHIP PACKAGE AND METHOD FOR DESIGNING THE SAME

CROSS REFERENCE TO RELATED APPLICATIONS

This application is a divisional of pending U.S. patent application Ser. No. 11/946,255, filed Nov. 28, 2007, which claims the benefit of U.S. Provisional Application No. 60/953,475, filed Aug. 2, 2007, the entirety of which are incorporated by reference herein.

BACKGROUND OF THE INVENTION

1. Field of the Invention

The present invention relates to a semiconductor chip package and method for designing the same, and in particular to a semiconductor chip package with stagger vias and method for designing the same.

2. Description of the Related Art

FIG. 1 shows a cross section of a conventional semiconductor chip package 10. The semiconductor chip package 10 mainly comprises a package substrate 100 and a chip 106. The chip 106 is mounted on the top surface 102 of package substrate 100 and has a plurality of bonding pads 108 thereon. A plurality of fingers 112 and conductive traces 114, made of conductive material, are also formed on the top surface 102. By drilling through the package substrate 100 and filling conductive material therein, vias 116 are formed. Bonding wires 110, each having two ends disposed on one bonding pad 108 and one finger 112, electrically connects bonding pads 108 of the chip 106 to the fingers 112, to the conductive traces 114, and then to the vias 116. Ball pads 122 and conductive traces 124 are formed on the bottom surface 104. Attached on the ball pads 122 are solder balls 120. By way of solder ball conductance, ball pad 122, conductive traces 124, and chip 106 can electrically communicate with an external device. Each of the solder balls 120 are aligned at a distance away from any corresponding via 116, such that the package can be made by a cheaper manufacturing process. The conventional semiconductor chip package 10 may further comprise a top solder mask layer 101 on the top surface 102 and underlying the chip 106. The top solder mask layer 101 has openings to expose the fingers 112. The semiconductor chip package 10 may further comprise a bottom solder mask layer 105 on the bottom surface 104. The bottom solder mask layer 105 has openings to expose a portion of the ball pads 122, allowing solder balls 120 to be attached thereon.

As shown in FIG. 1, the vias 116 are located outside and far away from the zone where the corresponding ball pads 122 are. However, the ball pads and vias are closely placed in a finer ball pad pitch substrate due to the large number of balls required, it is difficult to place vias beside adjacent ball pads in a bonding fingers area as via-to-finger distance cannot be shorter than a predefined length. The finer ball pad pitch requirements thus force the vias to shift away from corresponding ball pads. The conductive trace connecting the vias and corresponding ball pads inevitably occupies certain routing space, which, if not occupied, may be utilized to route or form plating traces. The plating traces electrically connect all ball pads together before package substrate 100 is cut and singularized, allowing usage of a more economical electric-plating process. However, if not all ball pads and all fingers have corresponding plating traces, a higher-cost package substrate fabricating process, electroless plating or no plating line process is needed, thus increasing manufacture cost. Also, shifting vias far away may also result in longer conductive traces to the fingers or the ball pads, hindering electrical performances.

BRIEF SUMMARY OF INVENTION

A semiconductor chip package and method for designing the same are provided. An exemplary embodiment of the semiconductor chip package comprises a package substrate having a top surface and a bottom surface. Additionally, there are at least four adjacent ball pads on the bottom surface, arranged in a first two-row array along a first direction and a second direction. There are also at least four vias drilled through the package substrate, arranged in a second two-row array. Meanwhile, each of the vias in the row of the second two-row array is offset by a first distance along the first direction and a second distance along the second direction from the connecting ball pads in the row of the first two-row array. Additionally, each of the vias in the other adjacent row of the second two-row array is offset by the first distance along an opposite direction to the first direction and the second distance along the second direction from the connecting ball pads in the other adjacent row of the first two-row array.

Another exemplary embodiment of the semiconductor chip package comprises a package substrate having a top surface and a bottom surface. Additionally, there are at least four adjacent vias drilled through the package substrate arranged in two adjacent rows offset from each other and at least two ball pads on the bottom surface between the two adjacent rows of the adjacent vias. There is also a plurality of fingers on the top surface substantially on and along a row direction (in a ball pad region), wherein the fingers is substantially positioned in a waved arrangement.

Yet another exemplary embodiment of the semiconductor chip package comprises a package substrate having a top surface and a bottom surface, a plurality of ball pads on the bottom surface arranged in a row, and a plurality of adjacent vias through the substrate arranged in two adjacent via rows offset from each other. Meanwhile, the ball pads are located between the two adjacent via rows, and a plurality of fingers placed on the top surface and between two of the ball pads. The fingers are substantially positioned in a waved arrangement along a row direction through the ball pads.

Yet another exemplary embodiment of the semiconductor chip package comprises a package substrate with a top surface and a bottom surface. There are four adjacent ball pads formed on the bottom surface arranged at four corners of a quadrangle with two rows and two columns. The four adjacent ball pads comprise two first ball pads along a first column and two second ball pads along a second column. There are four vias through the package substrate, each electrically connected to one of the four adjacent ball pads, comprising two first vias staggered along the first column and two second vias staggered along the second column.

An exemplary embodiment of a semiconductor chip package design method comprises providing a top virtual layer, a bottom virtual layer and a via virtual layer for use by a semiconductor chip package design program. Meanwhile, ball pad locations are defined on the bottom virtual layer according to a semiconductor chip package product specification, wherein consecutive ball pad locations are located on a ball pad straight line, defining allowable via locations on the via virtual layer arranged in an upper straight line and a bottom straight line. Additionally, the ball pad straight line is sandwiched between the top and bottom straight line and each allowable via location is positioned away from one corresponding ball pad location at a minimum distance allowed in a design rule. A wave is defined on the top virtual layer, wherein the wave waves above and along the ball pad straight line; meaning preferred locations for fingers. The semiconductor chip package is manufactured according to the top virtual layer, the bottom virtual layer, the via virtual layer, and a semiconductor chip specification, such that the semiconductor chip package comprises a package substrate with a top surface and a bottom surface. Additionally, the semiconductor chip package comprises ball pads on the bottom surface, located on corresponding consecutive ball pad locations as defined on the bottom virtual layer, vias through the package substrate, on the allowable via locations as defined on the via virtual layer, and actual fingers formed on the top surface, along the wave as defined on the top virtual layer, wherein the actual fingers are capable of depicting the wave.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 6A to 6C illustrate a method for defining finger pattern locations on the top virtual layer.

DETAILED DESCRIPTION OF INVENTION

Figure 1:
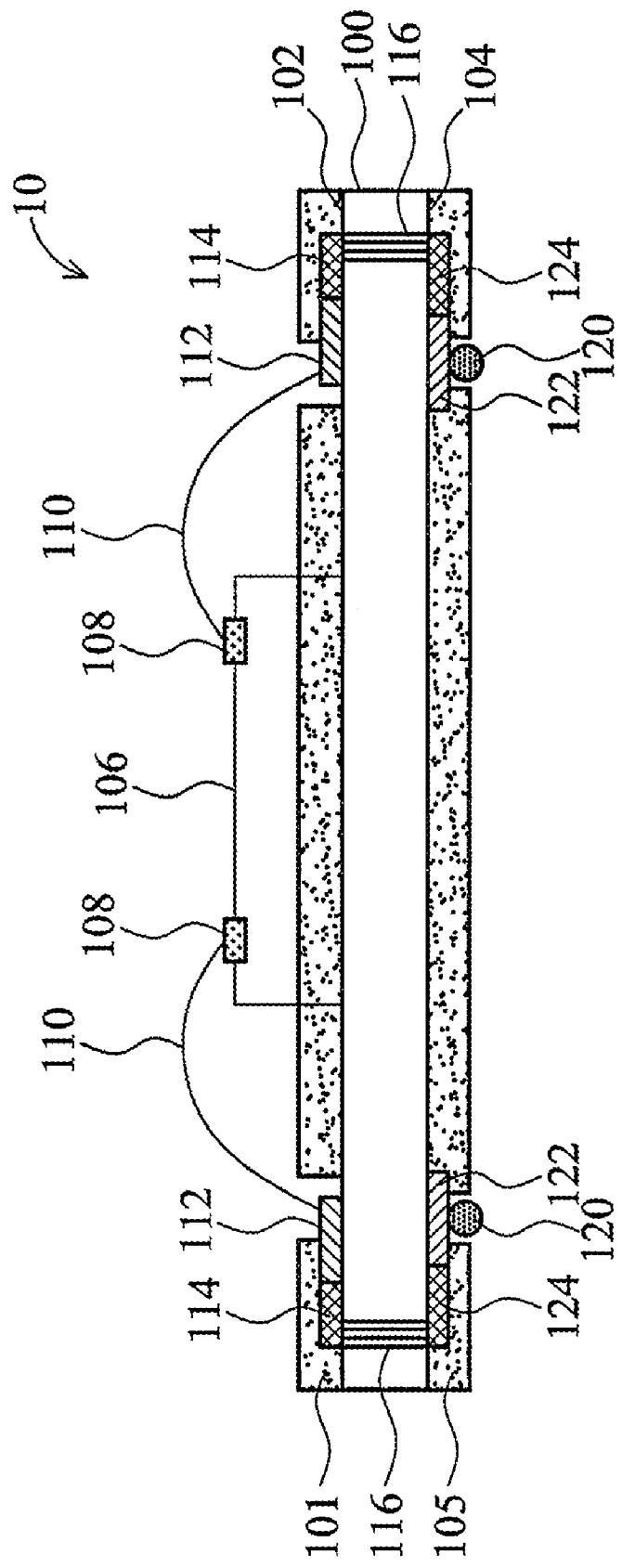
FIG. 1 shows a cross section of a conventional semiconductor chip package.

The following description is of a mode of carrying out the invention. This description is made for the purpose of illustrating the general principles of the invention and should not be taken in a limiting sense. The scope of the invention is best determined by reference to the appended claims. Wherever possible, the same reference numbers are used in the drawing and the description to refer the same or alike parts.

Figure 8A:
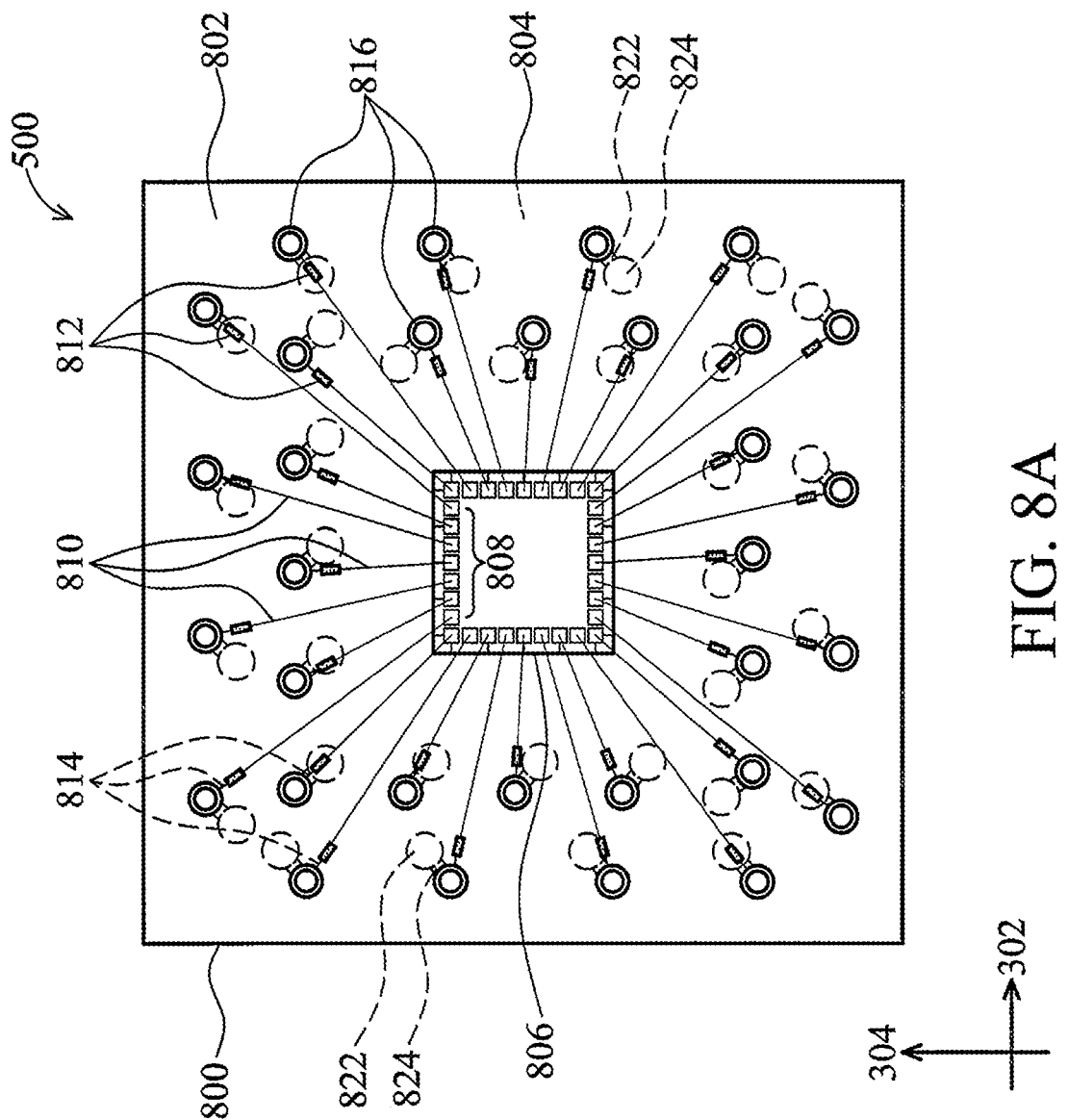
FIG. 8A shows a top view of one exemplary embodiment of a semiconductor chip package of the invention.
Figure 8B:
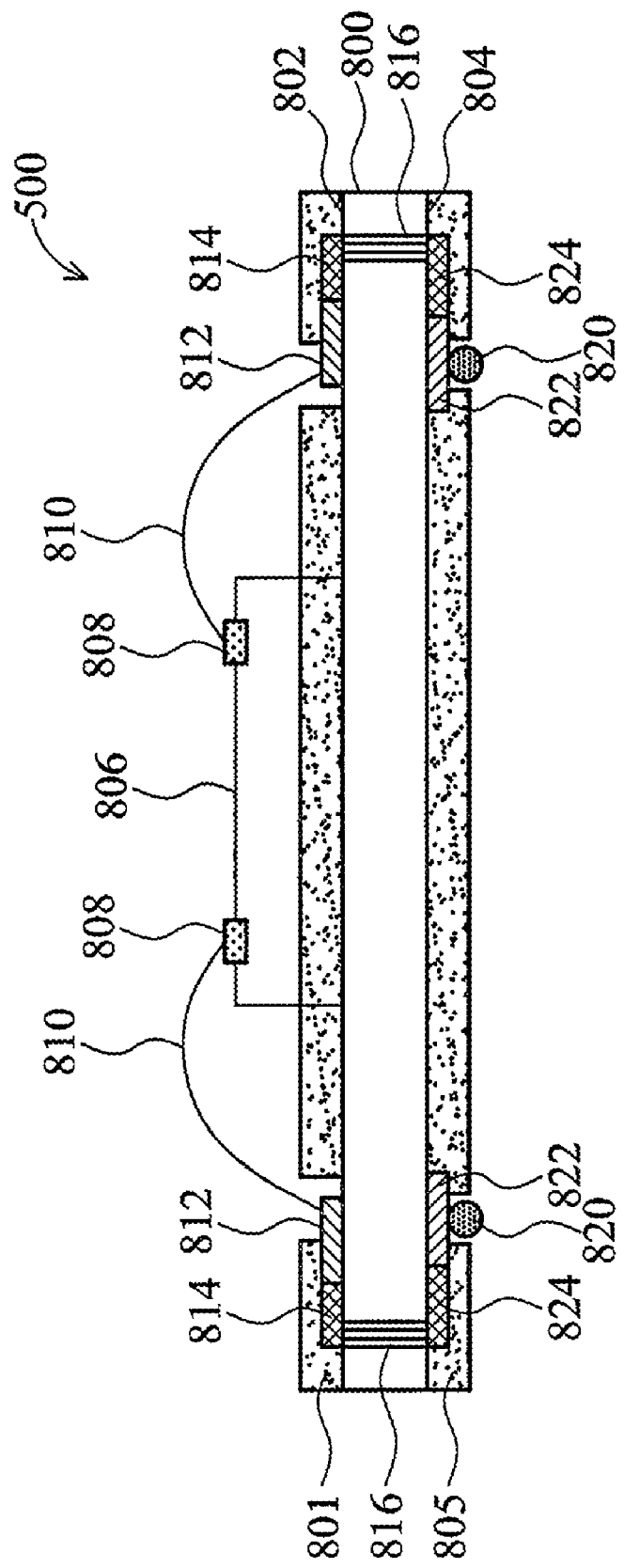
FIG. 8B shows a cross section of FIG. 8A.
Figure 8C:
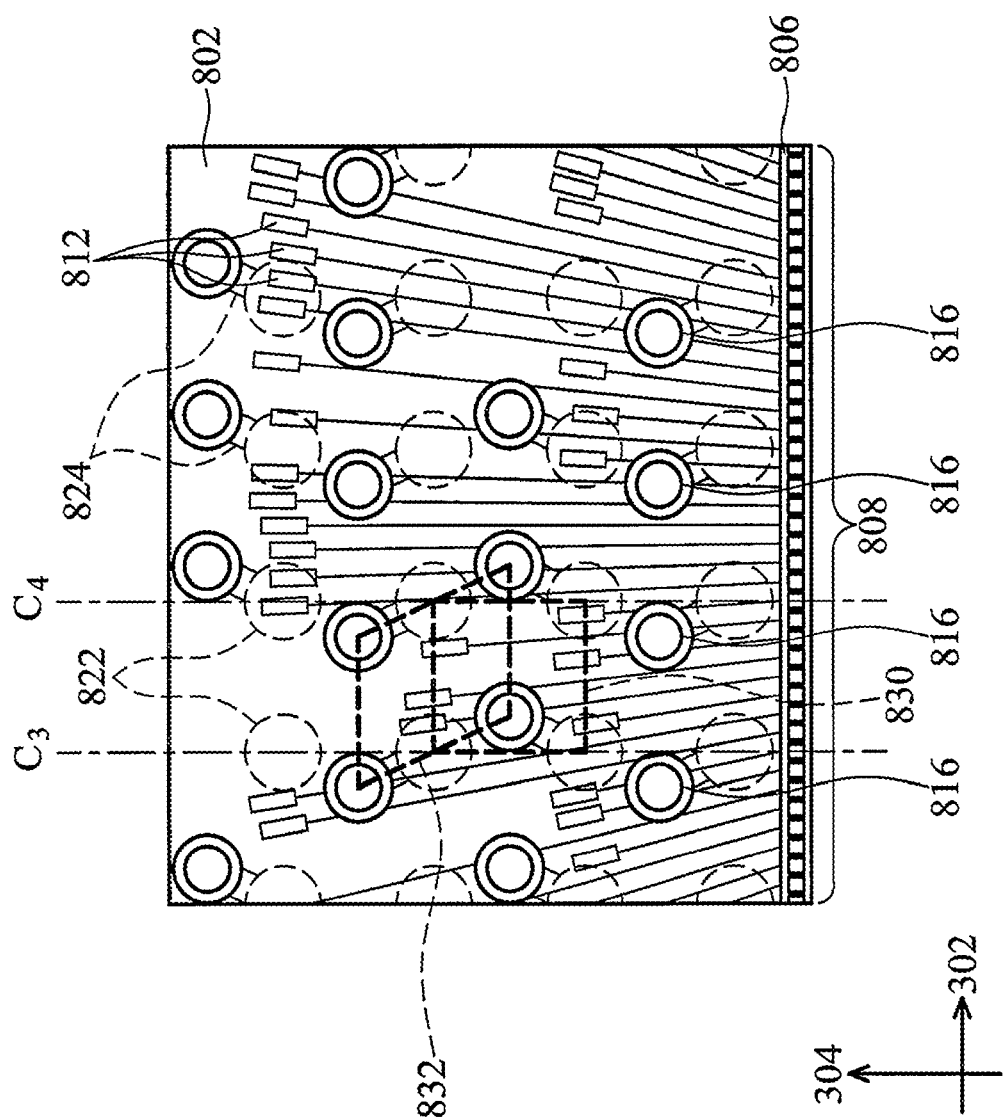
FIG. 8C illustrates an enlarged top view of a portion of another exemplary embodiment of a semiconductor chip package of the invention.

FIGS. 8A to 8C show one exemplary embodiment of a semiconductor chip package 500 of the invention. Semiconductor chip package 500 comprises a package substrate 800 having a top surface 802 and a bottom surface 804. In one embodiment, semiconductor package substrate 800 may comprise plastic materials, ceramic materials or the like. Chip 806 is mounted on the top surface 802, having a plurality of bonding pads 808 thereon. A row of bonding pads 808 may be arranged substantially parallel to an edge of the chip 806, providing input/output (I/O), power supply or grounding connections of the chip 806. In one embodiment, bonding pads 808 may comprise conductive materials, such as, Cu, Sn, Ni, Cr, Ti, and Cu or combinations thereof. A plurality of fingers 812 and conductive traces 814 are also on the top surface 805, away from the chip 806. In one embodiment, fingers 812 and conductive traces 814 may also comprise the same conductive materials with the bonding pads 808. Drilling through the package substrate 800 forms vias 816, filled with conductive materials. A set of bonding wires 810 are on the top surface 805, providing electrical connection between the fingers 812 and bonding pads 808. As shown in FIG. 8A, each finger 812 is electrically connected to one corresponding via 816 through a conductive trace 814. As shown in FIGS. 8A and 8B, a plurality of ball pads 822 and conductive traces 824 may be formed on the bottom surface 804. As ball pads 822 and conductive traces 824 normally cannot be seen from a top view, they are profiled by dashed lines in FIG. 8A. In one embodiment, ball pads 822 and conductive traces 824 may also comprise the same conductive materials with fingers 812 or conductive traces 814. Ball pads 822 are electrically connected to vias 816 through conductive traces 814. In one embodiment, semiconductor chip package 500 may further comprise solder balls 820 (shown in FIG. 8B) formed on ball pads 822, electrically connected to vias 816 through ball pads 822 and conductive traces 824. Alternatively, the semiconductor chip package 500 may further comprise ground rings (not shown) and parallel power rings (not shown) formed on the top surface 802 between conductive materials the same chip 806 and fingers 812, surrounding the chip 806. Ground rings (not shown) may be electrically connected to the bonding pads 808 through bonding wires 810 to provide a ground path. The power rings (not shown) may be electrically connected to the bonding pads 808 through bonding wires 810 to supply power to the chip 806. Semiconductor chip package 500 may further comprise a top solder mask layer 801 (shown in FIG. 8B) covering the top surface 802 and underlying chip 806, having openings to expose fingers 812. Semiconductor chip package 500 may further comprise a bottom solder mask layer 805 (shown in FIG. 8B) on the bottom surface 804, having openings to expose a portion of ball pads 822, allowing solder balls 820 to be attached.

Figure 2:
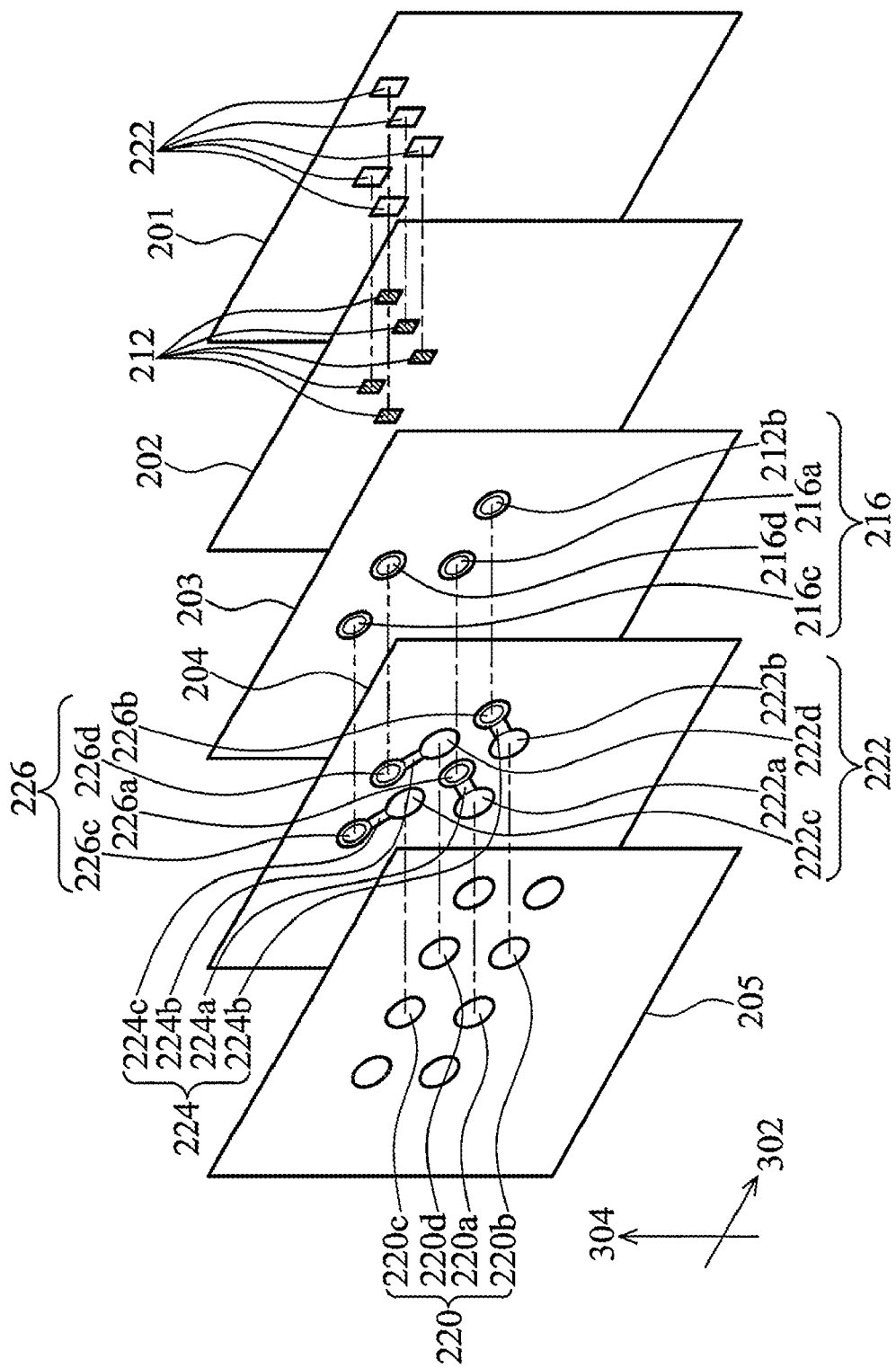
FIG. 2 illustrates a semiconductor chip package design method for fabricating one exemplary embodiment of the semiconductor chip package of the invention.

In one embodiment, the semiconductor chip package 500 can be fabricated according to a semiconductor chip package design method of the invention. A package design usually starts by using a computer aided design tool, a program of which provides several virtual layers corresponding to actual layers on or within a package. FIG. 2 illustrates virtual layers used in a semiconductor chip package design method for fabricating one exemplary embodiment of the semiconductor chip package 500 of the invention. Dashed lines shown in FIG. 2 indicates the alignment between two virtual layers. A top solder mask virtual layer 201, a top virtual layer 202, a via virtual layer 203, a bottom virtual layer 204 and a bottom solder mask virtual layer 205 are provided for use by a semiconductor chip package design program. In one embodiment, the bottom solder mask virtual layer 205 is used to indicate solder ball locations, substantially having solder ball opening patterns 220. Bottom virtual layer 204, which has ball pad patterns 222, trace patterns 224 and via patterns 226, is used to indicate ball pad locations, trace locations and via locations. Ball pad patterns 222 and corresponding via patterns 226 are connected through trace patterns 224. Via virtual layer 203 having via patterns 216 is used to indicate via locations, which also affect via patterns 226 of the bottom virtual layer 204. The top virtual layer 202 having finger patterns 212 is used to indicate finger locations. The top virtual layer 202 also has trace patterns (not shown) connecting via patterns and fingers thereon. The top solder mask virtual layer 201, having finger patterns opening 222, is used to indicate finger opening locations. As shown in FIG. 2, four adjacent ball opening patterns 220a, 220b, 220d and 220d on the bottom solder mask virtual layer 205 are aligned to four adjacent ball pad patterns 222a, 222b, 222d and 222d on the bottom virtual layer 204, respectively. Four adjacent via patterns 226a, 226b, 226d and 226d on the bottom virtual layer 204 are aligned to four adjacent via patterns 216a, 216b, 216d and 216d on the via virtual layer 203, respectively. Each finger pattern 212 is aligned to a corresponding finger opening pattern 222. It is noted that the aforementioned top solder mask virtual layer 201, the top virtual layer 202, the via virtual layer 203, the bottom virtual layer 204 and the bottom solder mask virtual layer 205 do not intend to limit the fabricating procedure of the semiconductor chip package 500. The patterns that belong to each aforementioned virtual layer only provide suggested locations but is not intended to limit the number of the locations in the invention. In one embodiment, all the locations of physical vias, fingers, ball pads, conductive traces of a semiconductor chip package are positioned as suggested in FIG. 2, however, in other embodiments, some of the locations do but some don't.

Figure 3:
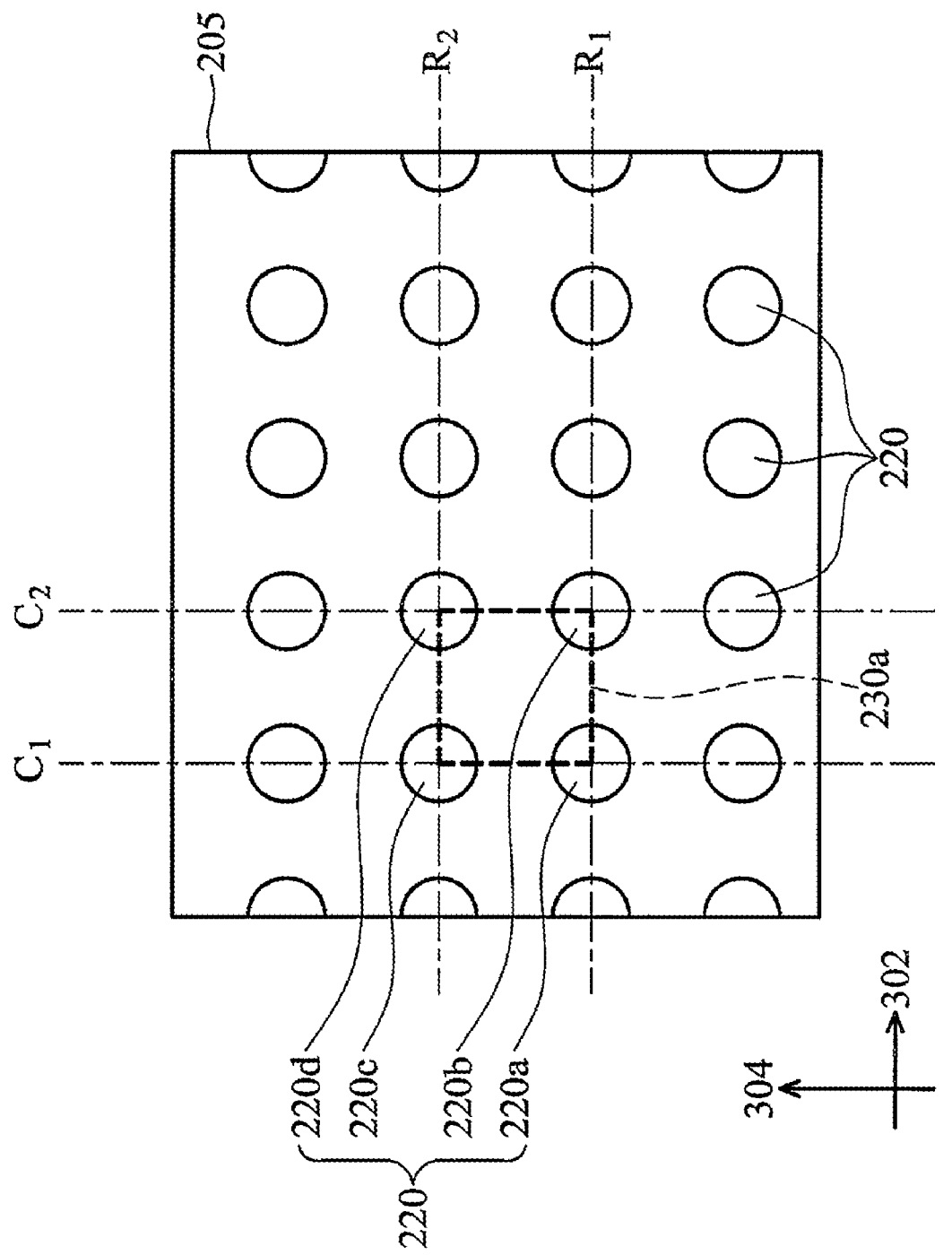
FIG. 3 illustrates a bottom solder mask virtual layer showing the ball opening patterns.

FIG. 3 illustrates a bottom solder mask virtual layer 205 showing the ball opening patterns 220. Ball opening patterns 220 are arranged in an array according to the locations of ball pad patterns 222 on the bottom virtual layer 204 as shown in FIG. 2. The size of each ball opening patterns 220 may be slightly larger than that of ball pad patterns 222 with a similar shape. For example, the four adjacent ball opening patterns 220a, 220b, 220d and 220d on the bottom solder mask virtual layer 205 are arranged in a first two-row array 230a and laid out along a row direction 302 and a column direction 304 as shown in FIG. 3. In one embodiment, row direction 302 is perpendicular to column direction 304. The first two-row array 230a has a first row $R_1$ and a second row $R_2$, and a first column $C_1$ and a second column $C_2$. In one embodiment shown in FIG. 3, the four adjacent ball opening patterns 220a, 220b, 220d and 220d of the first two-row array 230a are arranged at four corners of a quadrangle (e.g. a square as shown in FIG. 3).

Figure 4A:
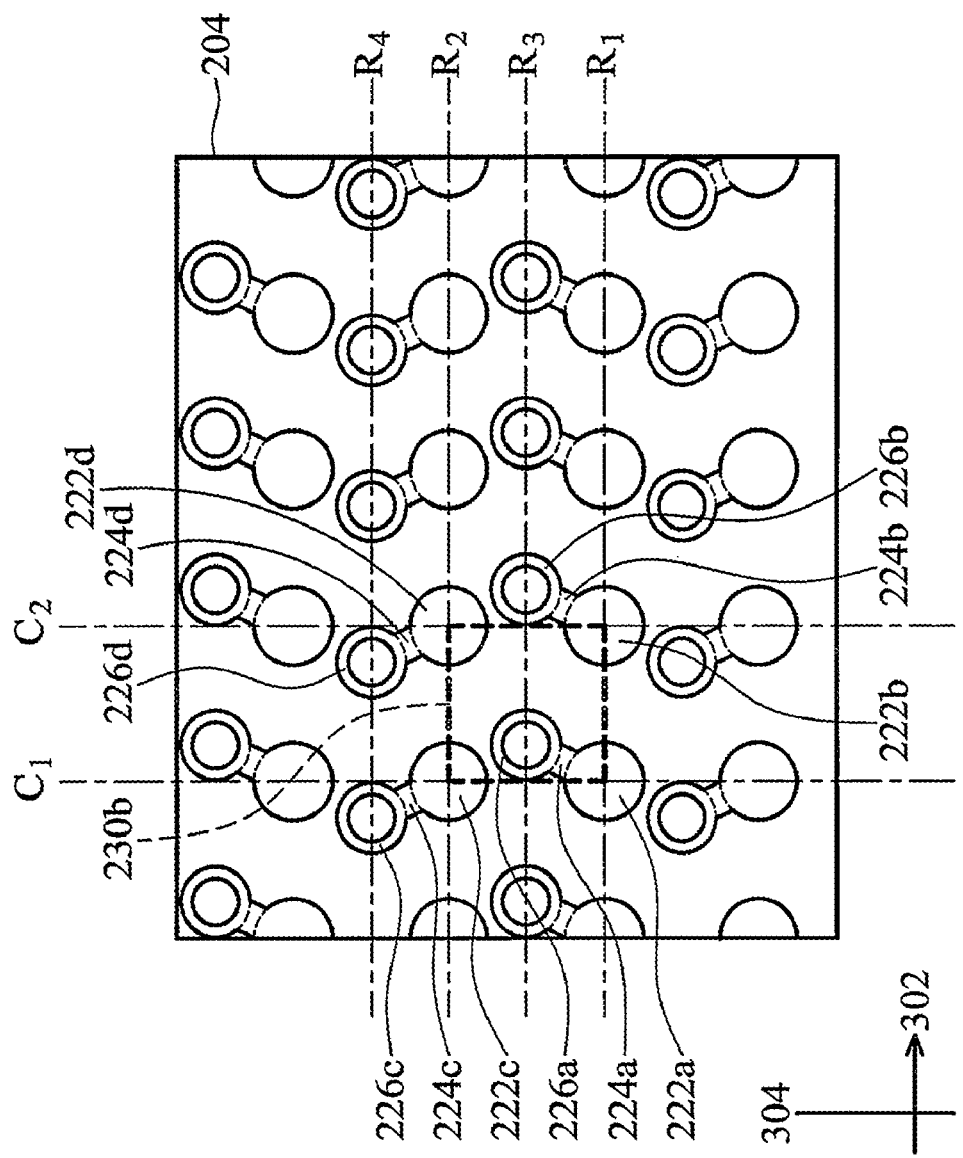
FIG. 4A illustrate a bottom virtual layer showing ball pad patterns, trace patterns and via patterns.
Figure 4B:
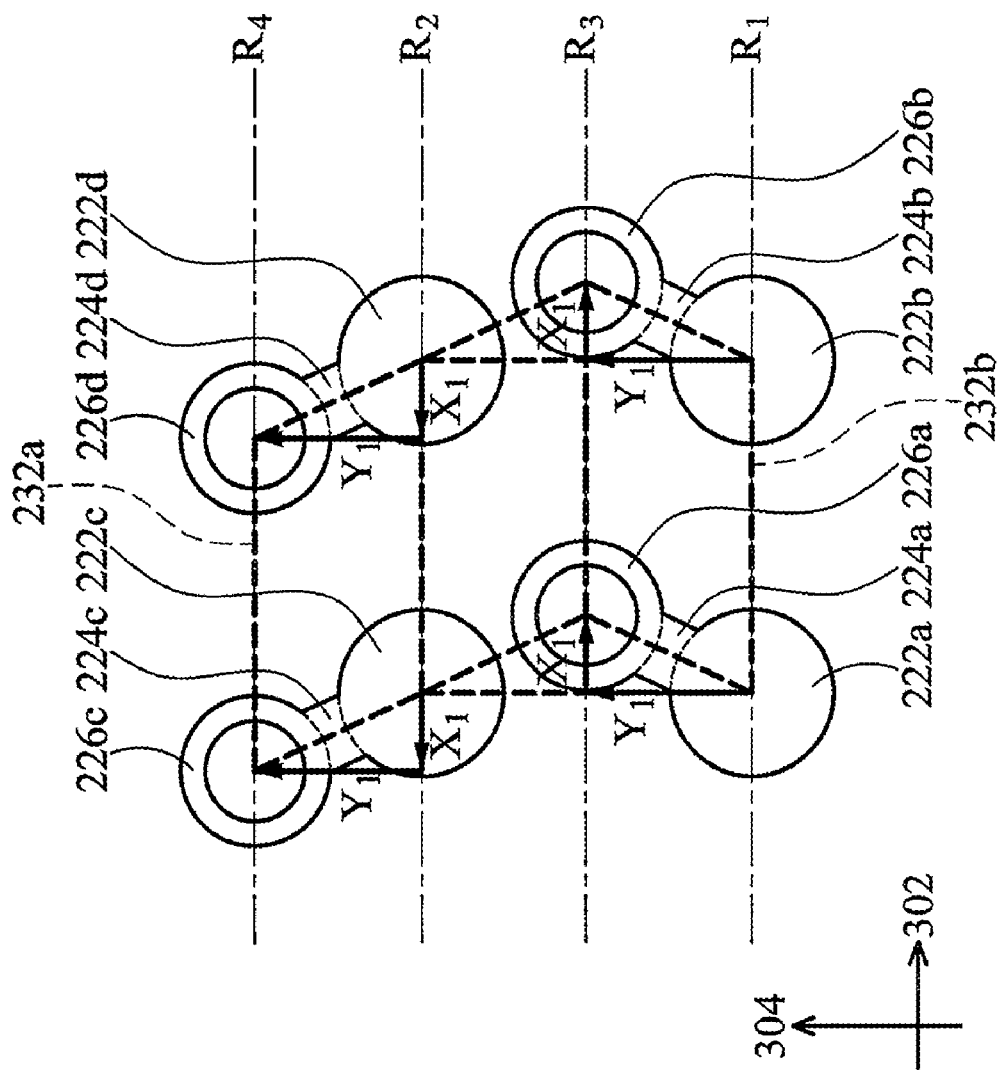
FIG. 4B illustrates an enlarged view of a portion of FIG. 4A.

FIG. 4A illustrates a bottom virtual layer 204 showing ball pad patterns 222, trace patterns 224 and via patterns 226. Generally, ball pad patterns 222 are arranged according to a semiconductor chip package product specification, indicating the solder ball and corresponding opening patterns 220 on bottom solder mask virtual layer 205 as shown in FIG. 2, such that ball pad patterns 222 are arranged in an array with rows and columns. Accordingly, rows $R_1$ and $R_2$ and columns $C_1$ and $C_2$ of FIG. 3 are also applicable to ball pad patterns 222 of FIG. 4A. For example, the four adjacent ball pad patterns 222a, 222b, 222c and 222d are arranged in another first two-row array 230b having row $R_1$ and row $R_2$ along row direction 302, wherein four adjacent vias patterns 226a, 226b, 226c and 226d are connected by trace patterns 224a, 224b, 224c, and 224d to four adjacent ball pad patterns 222a, 222b, 222c and 222d, respectively. The first two-row array 230b in FIG. 4A has a location aligned to the first two-row array 230a in FIG. 3. Referring to both FIGS. 4A and 4B, where FIG. 4B enlarges a portion of FIG. 4A, via patterns 226a, 226b, 226d and 226d are arranged in a second two-row array 232a having row $R_3$ and row $R_4$ along row direction 302. Each of the via patterns 226a and 226b in row $R_3$ of the second two-row array 232 is offset by a first distance $X_1$ along the row direction 302 and a second distance $Y_1$ along the column direction 304 from a corresponding ball pad pattern (222a or 222b) in row $R_1$ of the first two-row array 230b. Each of the via patterns 226c and 226d in row $R_4$ of the second two-row array 232a is offset by the first distance $X_1$ along an opposite direction to the row direction 302 and the second distance $Y_1$ along the column direction 304 from a corresponding ball pad pattern (222c or 222d) in row $R_2$ of the first two-row array 230b. Each via pattern 226, indicating a location where an actual via on a semiconductor chip package is allowed or suggested to form, is suggested to position away from one corresponding ball pad pattern 222 at a minimum distance allowed in a design rule in order to maximize the space available for placing one or more conductive traces between two columns in FIG. 4A. Therefore, a ball pad row, such as the second row $R_2$, is sandwiched between two adjacent via rows, such as the third row $R_3$ and the fourth row $R_4$. As shown in FIGS. 4A and 4B, two adjacent via patterns 226a and 226c are staggered along column $C_1$, and two other adjacent via patterns 226b and 226d are staggered along column $C_2$.

Figure 5:
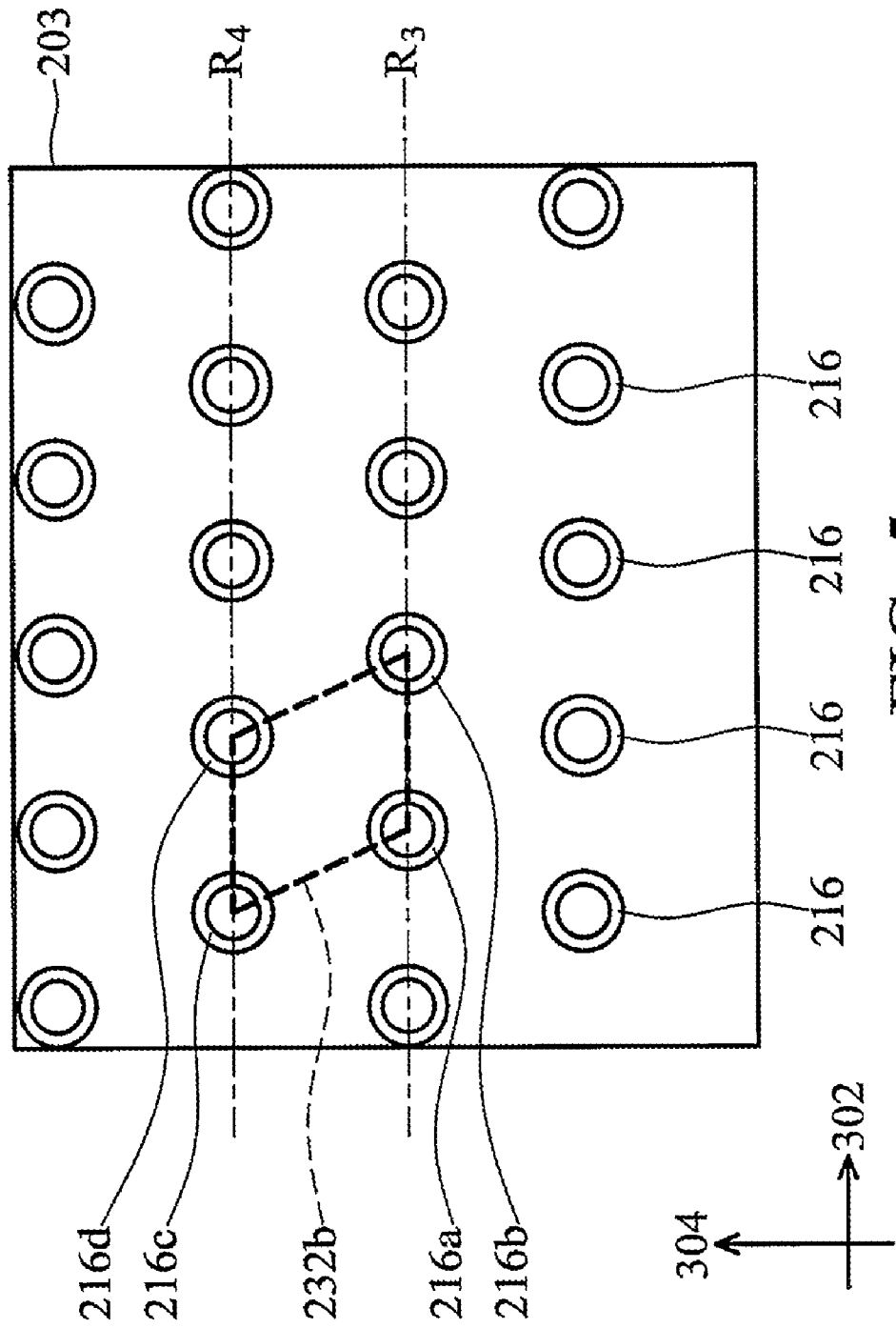
FIG. 5 shows a via virtual layer showing via patterns.

FIG. 5 shows a via virtual layer 203 with via patterns 216. The via patterns 216 are substantially the same or aligned to the via patterns 226 in the bottom virtual layer 204, for both via patterns 216 and via patterns 226 refer to the aforementioned allowable or suggested via locations on a semiconductor chip package. Similar to the via patterns of FIG. 4A, four adjacent via patterns 216a, 216b, 216c and 216d are arranged in another second two-row array 232b. The second two-row array 232b has a location corresponding to the second two-row array 232a as shown in FIG. 4B. As shown in FIG. 5, any two of the via patterns in adjacent rows, for example, via pattern 216a in row $R_3$ and via pattern 216c in row $R_4$, are staggered along column direction 304. Comparing to a row of ball pad pattern, via patterns in one via row are shifted to the right while via patterns in an adjacent via row are shifted to the left. Therefore, any four adjacent via patterns, for example, the four adjacent via patterns 216a, 216b, 216c and 216d, are arranged at four corners of a parallelogram instead of a rectangular.

Figure 6B:
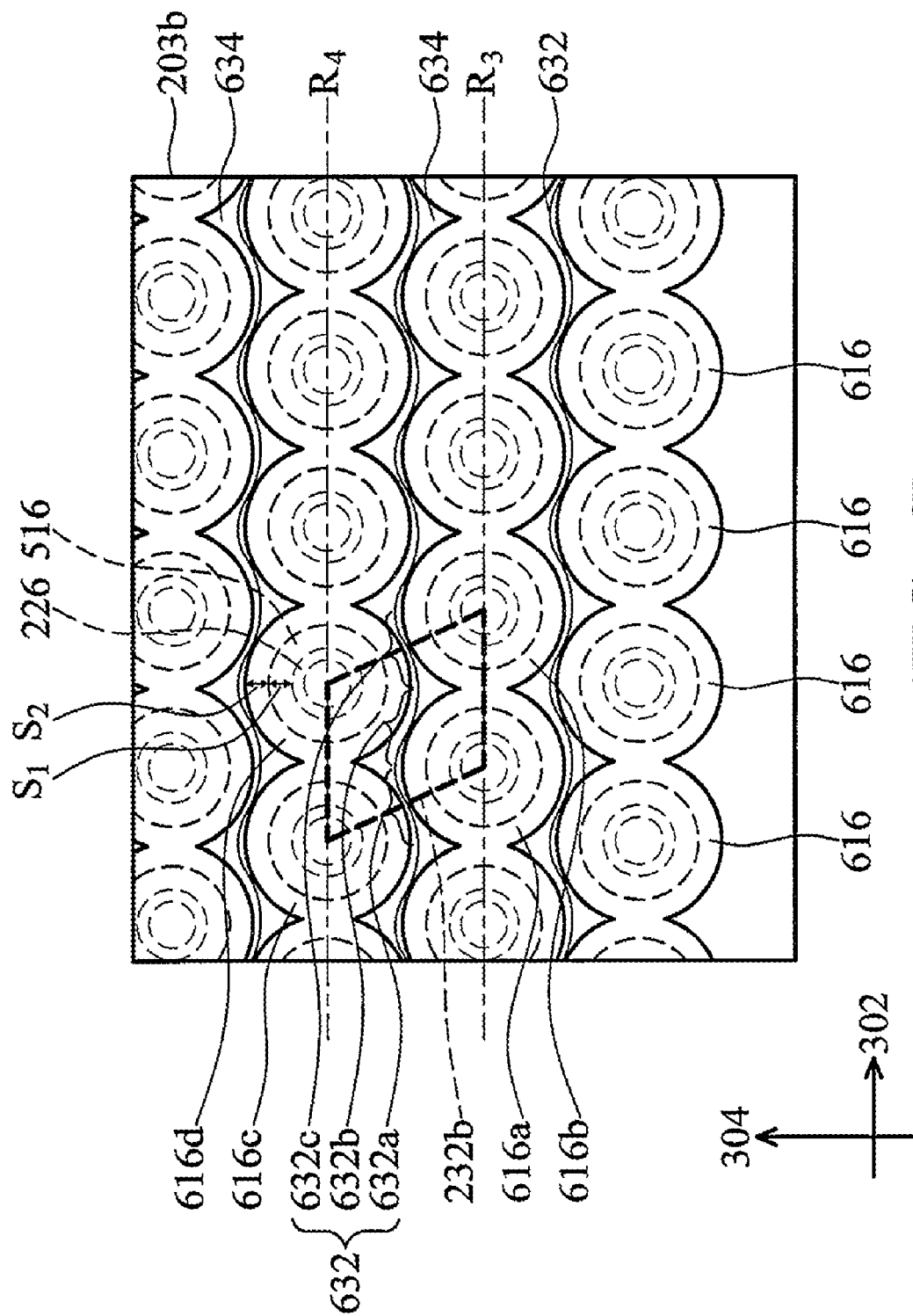
Figure 6C:
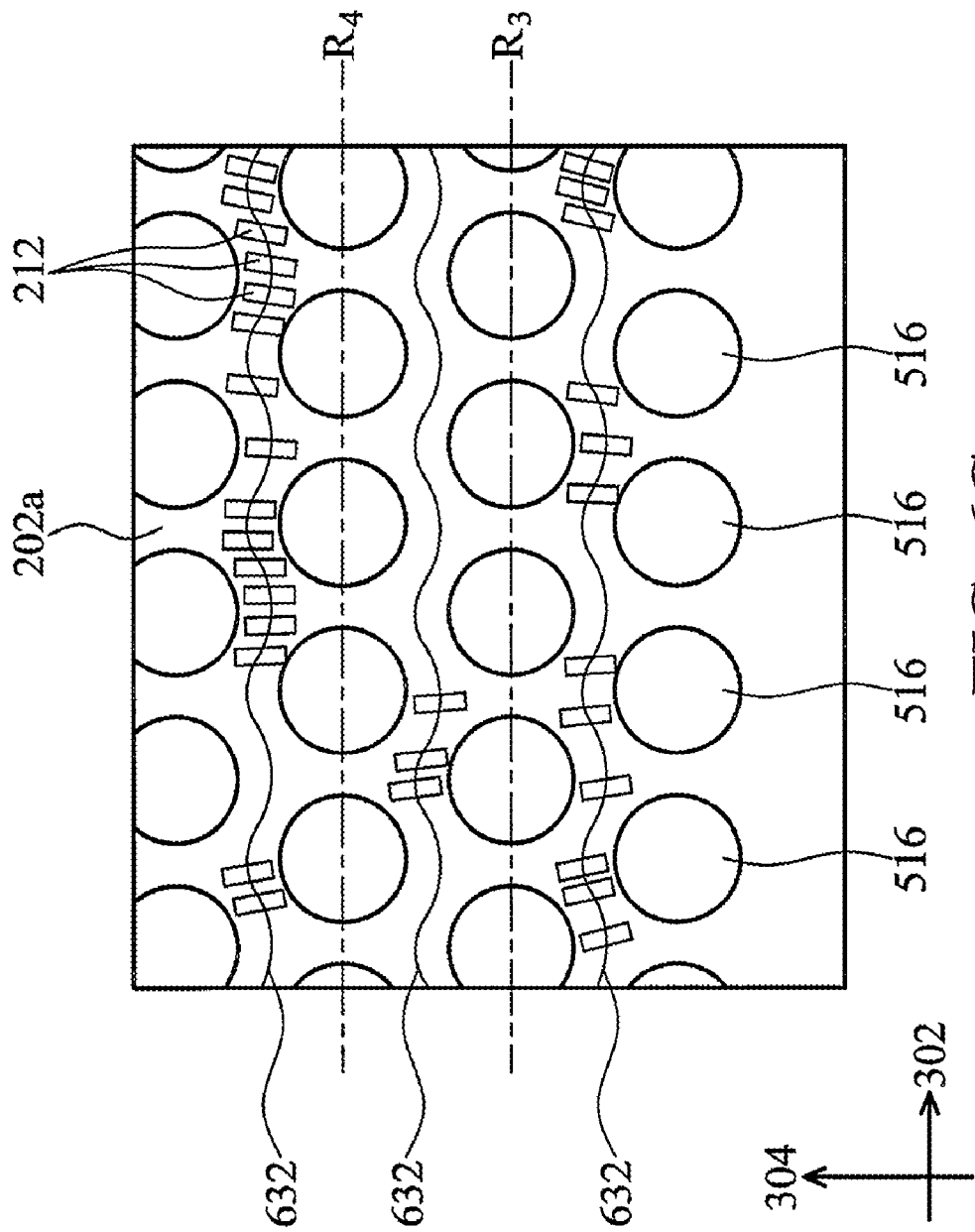

FIGS. 6A to 6C illustrate a method for finding suggested finger pattern locations on the top virtual layer 202 of FIG. 2. FIG. 6A illustrates another via virtual layer 203a having a finger placing area 532 outside of the expanded virtual via patterns 516, defined by expanding each via pattern 226 with a distance $S_1$, for example, $S_1$ is a minimum via-to-finger spacing defined in a semiconductor chip package product specification. Finger placing area 532, means an allowable area for placing fingers without violating a design rule if a semiconductor chip package product does have a specific, regular via pattern arrangement as shown in FIG. 5. For example, fingers can be placed at any portion of finger placing area 532 between expanded virtual via patterns 516a, 516b, 516c and 516d. FIG. 6B illustrates a via virtual layer 203b with a finger placing guideline 632. The finger placing guideline 632 means preferred locations for placing the centers of fingers. Finger placing forbidden zone 616 is defined by further expanding the associating virtual via patterns 516 in FIG. 5. The expanding distance is $S_2$, for example, $S_2$ is half a minimum finger length as defined in a semiconductor chip package product specification. In other words, fingers will completely comply with the required design rule if their centers are located outside of the forbidden zone 616. Therefore, as shown in FIG. 6B, finger placing guideline 632 can be any line within the area outside of the finger placing forbidden zone 616. If a single straight line is not possible, finger placing guideline 632 may be a set of internal common tangents of the expanded virtual via patterns consisting of the finger placing forbidden zone 616. As shown in FIG. 6B, finger placing guideline portion 632a, a portion of the finger placing guideline 632, for example, is an internal common tangent between expanded virtual via patterns 616a and 616c. Finger placing guideline portion 632b is an internal common tangent between expanded virtual via patterns 616a and 616d. A finger placing guideline portion 634c is an internal common tangent between expanded virtual via patterns 616b and 616d. As shown also in FIG. 6B, finger placing guideline 632 has a wave form waving substantially along the row direction 302. FIG. 6C illustrates a top virtual layer 202a showing finger patterns 212 placed along the finger placing guidelines 632. FIG. 6C also illustrates a relationship between exemplified finger patterns 212 and expanded virtual via patterns 516 (of FIG. 6A). As shown in FIG. 6C, finger patterns 212, whose centers are substantially placed on one of finger placing guidelines 632, do not overlap expanded virtual via patterns 516, whose boundaries are at least $S_1$ away from any via patterns 226 (of FIG. 6A).

Figure 7:
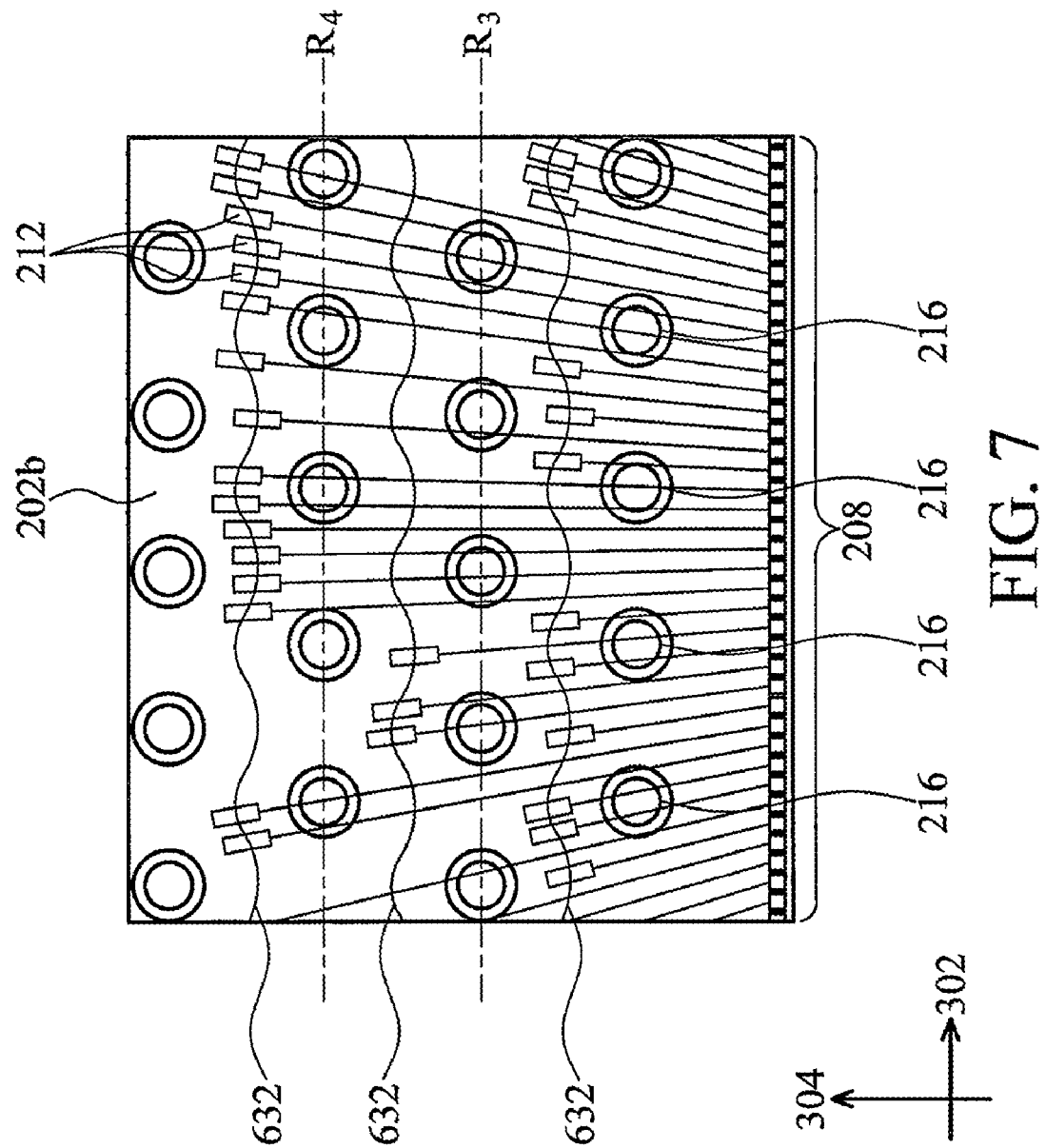
FIG. 7 illustrates another top virtual layer showing the finger patterns placed along the finger placing guideline.

FIG. 7 illustrates exemplified finger patterns 212 placed along finger placing guidelines 632 on the top virtual layer 202b, as well as via patterns 216, bonding pads patterns 208 on a chip, and bonding wire patterns 210 connecting finger patterns 212 and bonding pads patterns 208. Bonding wire patterns 210 and bonding pads patterns 208 are used to demonstrate locations of actual bonding wires and bonding pads, respectively. As shown in FIG. 7, finger patterns 212 are substantially positioned in a waved arrangement on finger placing guidelines 632. Finger patterns 212 are also substantially along row direction 302, and substantially parallel to the arranged direction of the bonding pads patterns 208 or to an edge of the chip. The bonding wire patterns 210 connect the finger patterns 212 and the bonding pads patterns 808, having a direction substantially along the column direction 304.

Meanwhile, referring again to FIGS. 8A to 8C, exemplary embodiments of the semiconductor chip package 500 of the invention are manufactured according to a top virtual layer 202, a via virtual layer 203 and a bottom virtual layer 204 of FIG. 2 and based upon the illustrations and descriptions of FIGS. 4A to 7. Accordingly, semiconductor chip package 500 comprises a package substrate 800 with a top surface 802 and a bottom surface 804. Ball pads 822 are on bottom surface 804, located on corresponding consecutive ball pad patterns 222 as defined on the bottom virtual layer 204 as shown in FIG. 4A. Vias 816 are through the package substrate, some of which are on the allowable via locations as defined by via patterns 216 of via virtual layer 203 in FIG. 5. FIG. 8C illustrates a top view enlarging a portion of another exemplary embodiment of a semiconductor chip package of the invention. As shown in FIG. 8C, inside an area, whose four corners are four adjacent vias 816 on two adjacent via rows, for example, area 832, each of the four vias 816 is electrically connected to one of the four adjacent ball pads 822 enclosed by area 830. Additionally, inside an area, whose four corners are four adjacent ball pads 822 on two adjacent via rows, for example, area 830, two of the four adjacent vias 816 enclosed by area 832 are electrically connected to two of ball pads 822 enclosed by area 830, respectively. As shown in FIG. 8C, four vias 816 are at the four corners of area 832 and comprises two vias 816 staggered along column $C_3$ and other two vias 816 staggered along the column $C_4$. As shown in FIGS. 8A-8C, actual fingers 812 are formed on the top surface 802, some of which are substantially along finger placing guidelines 632 of FIG. 7 and capable of depicting the wave(s) of finger placing guidelines 632, wherein the wave may pass right over the consecutive ball pads 822. Also, the wave may pass right over the center of two consecutive ball pads. In one embodiment, one of fingers 812 may be positioned on one ball pad 822 inside area 832 enclosed by four adjacent vias 816 on two adjacent via rows. Alternatively, finger(s) 812 may be placed between two adjacent ball pads 822. It is possible that some but not all vias 816 and fingers 812 are positioned according to locations suggested by via patterns 226 (of FIG. 4A) and finger placing guidelines 632 (of FIG. 6C). For a dense area having many vias close to each other, as illustrated and described in FIGS. 4A to 7, more spacing for forming plating traces are yielded. For a loose area, plating traces may be easily formed and routed differently to what is illustrated and described in FIGS. 4A to 7. Number of actual ball pads 822, vias 816 and fingers 812 are according to design, but not limited to the disclosure herein.

Figure 9:
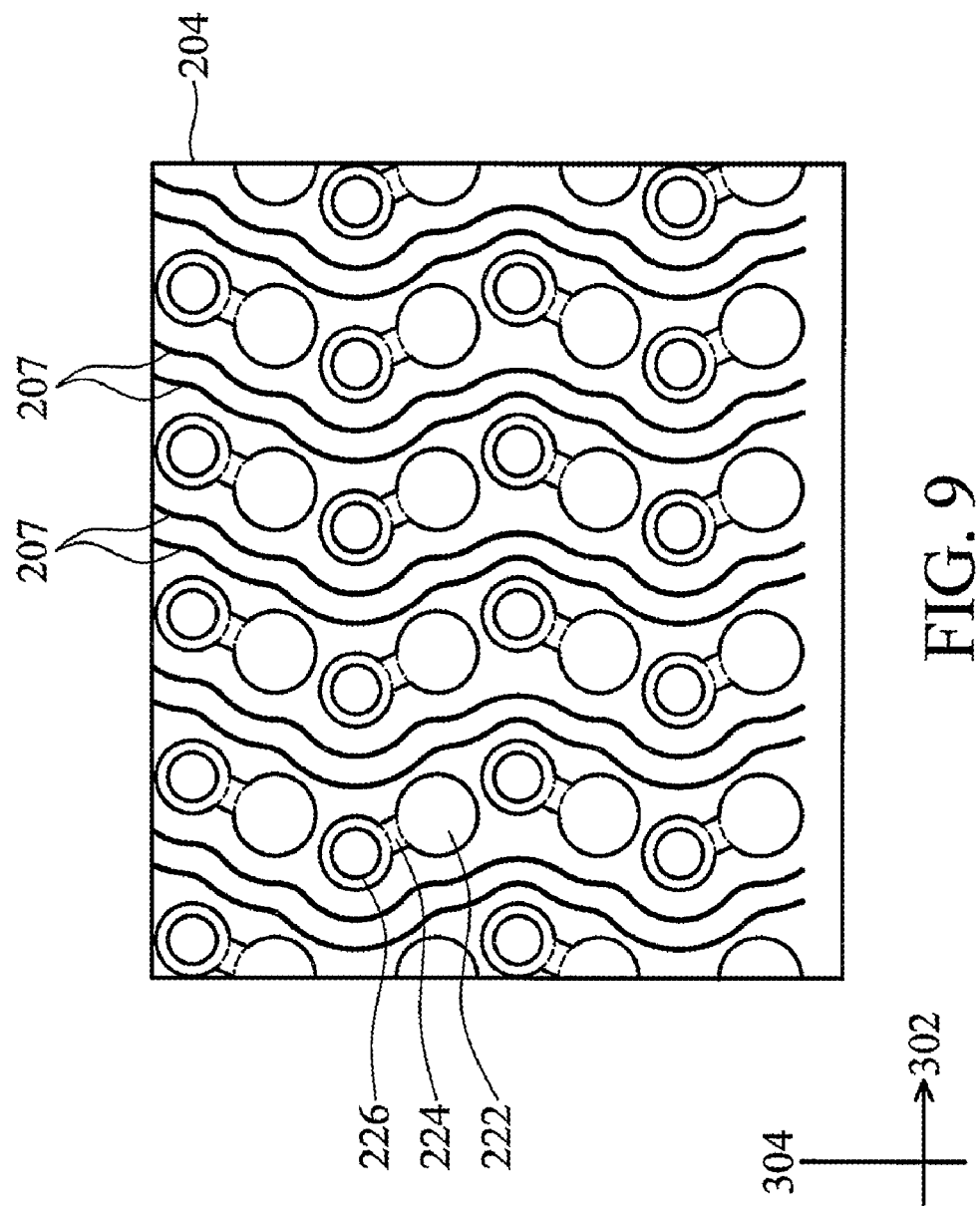
FIG. 9 illustrates the bottom virtual layer having plating traces placed between the ball pad patterns substantially along the column direction.

Some advantages of an exemplary embodiment of the semiconductor chip package 500 are described in the following. FIG. 9 illustrates a bottom virtual layer 204 having plating traces 270 placed between ball pad patterns 222 substantially along the column direction 304. Namely, the staggered vias design allows maximized available spacing for routing plating traces in a bottom layer. Therefore, allowing usage of a lower-cost electrolytic plating manufacture process to reduce process cost. Compared with the conventional in-line finger placement, the finger placement according to exemplary embodiments of the invention can be substantially along any one of the finger placing guidelines with more positional flexibility. Therefore, length of bonding wires can be reduced to have better electrical performance, such as, reduced resistance. Compared with the conventional semiconductor chip package, the ball pads, the vias and the fingers according to exemplary embodiments of the semiconductor chip package design method are under a more efficiently arrangement. Also, exemplary embodiments of the semiconductor chip package design method can be applied in all wire-bonding substrates, especially for finer ball pitches, for example, 0.6 mm or 0.5 mm, allowing finger overlapping with ball pad area.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor chip package, comprising:
    a package substrate having a top surface and a bottom surface;
    at least four adjacent ball pads on the bottom surface, arranged in a first two-row array along a first direction and a second direction; and
    at least four vias drilled through the package substrate, arranged in a second two-row array, wherein each of the vias in a row of the second two-row array is offset by a first distance along the first direction and a second distance along the second direction from a connecting ball pad in a row of the first two-row array, each of the vias in the other adjacent row of the second two-row array is offset by the first distance along an opposite direction to the first direction and the second distance along the second direction from a connecting ball pad in the other adjacent row of the first two-row array.

2. The semiconductor chip package as claimed in claim 1, further comprising a plurality of fingers on the top surface, between the two rows of the second two-row array, wherein the fingers are substantially positioned along the first direction.

3. The semiconductor chip package as claimed in claim 1, wherein the fingers are substantially positioned in a waved arrangement.

4. The semiconductor chip package as claimed in claim 1, wherein one of the fingers is positioned on one of the four adjacent ball pads, or the fingers are between two of the four adjacent ball pads.

5. The semiconductor chip package as claimed in claim 1, wherein each of the four vias is electrically connected to one of the four adjacent ball pads.

6. The semiconductor chip package as claimed in claim 1, wherein any two of the vias in adjacent rows are staggered along the second direction.

7. The semiconductor chip package as claimed in claim 1, wherein the first two-row array is a square array, and the second two-row array is a parallelogram array but not a rectangular array.

8. The semiconductor chip package as claimed in claim 1, further comprising a chip on the top surface, having a plurality of bonding pads thereon.

9. The semiconductor chip package as claimed in claim 1, wherein the first direction is substantially parallel to an edge of the chip.

10. A semiconductor chip package, comprising:
a package substrate having a top surface and a bottom surface;
a plurality of ball pads on the bottom surface, arranged in a row;
a plurality of adjacent vias through the substrate, arranged in two adjacent via rows offset form each other, wherein the ball pads are arranged between the two adjacent via rows; and
a plurality of fingers on the top surface and between two of the ball pads, wherein the fingers are substantially positioned in a waved arrangement substantially along a row direction through the ball pads.

11. The semiconductor chip package as claimed in claim 10, further comprising another finger positioned on one of the ball pads.

12. The semiconductor chip package as claimed in claim 10, wherein each of the ball pads is electrically connected to one of the adjacent vias.

13. The semiconductor chip package as claimed in claim 10, wherein the row direction through the ball pads is substantially parallel to an edge of a chip on the top surface.

14. A semiconductor chip package, comprising:
a package substrate with a top surface and a bottom surface;
four adjacent ball pads formed on the bottom surface, arranged at four corners of a square with two rows and two columns, comprising two first ball pads along a first column and two second ball pads along a second column;
four vias through the package substrate, each electrically connected to one of the four adjacent ball pads, comprising two first vias staggered along the first column and two second vias staggered along the second column.

15. The semiconductor chip package as claimed in claim 14, further comprising a finger formed on the top surface, substantially above one of the two rows and between two of the four adjacent ball pads.

16. The semiconductor chip package as claimed in claim 15, further comprising fingers formed on the top surface, wherein the fingers are positioned to wave along one of the two rows.

17. The semiconductor chip package as claimed in claim 15, further comprising another finger positioned above and on one of the four adjacent ball pads.

18. The semiconductor chip package as claimed in claim 14, wherein the two rows have a row direction substantially parallel to an edge of a chip on the top surface.

* * * * *